(12) United States Patent
Otake et al.

(10) Patent No.: US 11,797,738 B2
(45) Date of Patent: Oct. 24, 2023

(54) TEST APPARATUS, COMPUTER READABLE MEDIUM, AND TEST METHOD

(71) Applicant: MITSUBISHI ELECTRIC CORPORATION, Tokyo (JP)

(72) Inventors: Yuya Otake, Tokyo (JP); Satoshi Noguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 32 days.

(21) Appl. No.: 17/542,039

(22) Filed: Dec. 3, 2021

(65) Prior Publication Data

US 2022/0092243 A1 Mar. 24, 2022

Related U.S. Application Data

(63) Continuation of application No. PCT/JP2019/029177, filed on Jul. 25, 2019.

(51) Int. Cl.
*G06F 30/3308* (2020.01)

(52) U.S. Cl.
CPC .................. *G06F 30/3308* (2020.01)

(58) Field of Classification Search
USPC ........................................... 716/107
See application file for complete search history.

(56) References Cited

U.S. PATENT DOCUMENTS

| | | |
|---|---|---|
| 2003/0061208 A1 | 3/2003 | Ohashi |
| 2004/0064803 A1 | 4/2004 | Graves et al. |
| 2005/0267880 A1 | 12/2005 | Ohashi |
| 2006/0004776 A1 | 1/2006 | Ohashi |

(Continued)

FOREIGN PATENT DOCUMENTS

| | | |
|---|---|---|
| JP | 2003-99570 A | 4/2003 |
| JP | 2004-118850 A | 4/2004 |

(Continued)

OTHER PUBLICATIONS

Taiwanese Office Action and Search Report for Taiwanese Application No. 108148402, dated Nov. 29, 2021, with an English translation.

(Continued)

*Primary Examiner* — Bryce M Aisaka
(74) *Attorney, Agent, or Firm* — Birch, Stewart, Kolasch & Birch, LLP

(57) ABSTRACT

A design management apparatus (100) includes a conversion unit (12) and a test unit (13). The conversion unit (12) generates model information (403) that is a format of design information (303) being converted, the design information (303) being the design information (303) created in a process of mechanical design in an engineering chain, and generates model information (405) that is a format of design information (305) being converted, the design information (305) being the design information (305) created in a process of control design in the engineering chain. The test unit (13) associates the model information (403) and the model information (405) using entire reference information (22) that associates the model information (403) and the model information (405), and tests for consistency between the model information (403) and the model information (405) associated.

6 Claims, 10 Drawing Sheets

(56) References Cited

U.S. PATENT DOCUMENTS

2006/0041466 A1* 2/2006 Woehler ............... G06Q 10/087
                                                              705/7.31
2006/0052896 A1* 3/2006 Woehler ............... G06Q 10/087
                                                              700/107

FOREIGN PATENT DOCUMENTS

| JP | 2004-241002 A | 8/2004 |
| JP | 2005-242674 A | 9/2005 |
| JP | 2005-275972 A | 10/2005 |
| JP | 2006-201929 A | 8/2006 |
| JP | 2007-179264 A | 7/2007 |
| JP | 2011-186812 A | 9/2011 |

OTHER PUBLICATIONS

International Search Report (PCT/ISA/210) issued in PCT/JP2019/029177 dated Oct. 8, 2019.
Written Opinion (PCT/ISA/237) issued in PCT/JP2019/029177 dated Oct. 8, 2019.
Indian Office Action for Indian Application No. 202147054398, dated Jun. 30, 2022, with English translation.

* cited by examiner

TEST APPARATUS, COMPUTER READABLE MEDIUM, AND TEST METHOD

CROSS REFERENCE TO RELATED APPLICATIONS

This application is a Continuation of PCT International Application No. PCT/JP2019/029177, filed on Jul. 25, 2019, which is hereby expressly incorporated by reference into the present application.

TECHNICAL FIELD

The present invention relates to a test apparatus that tests for consistency in a plurality of pieces of design information with different formats.

BACKGROUND ART

Design processes such as product design, process design, mechanical design, electrical design, and control design are in an engineering chain where a factory automation system is developed. In the engineering chain, many designers create design information in each process using a dedicated tool that is according to a type of work. The designer maintains consistency of the design information that is being created by confirming the design information created in a previous process, and making an adjustment with a designer of the previous process. Because of a lack of understanding of other processes or a lack of adjustment between the designer of the previous process, ensuring consistency in the design information, however, takes person-hours.

With regard to this taking of person-hours, there is a disclosure of a consistency test device that tests for consistency between product CAD (Computer Aided Design) data that is shape data of a product, and parts management data that manages information of a plurality of parts used in a product (Patent Literature 1).

CITATION LIST

Patent Literature

Patent Literature 1: JP 2005-242674 A

SUMMARY OF INVENTION

Technical Problem

A purpose of the device disclosed in Patent Literature 1, however, is to investigate whether or not there is consistency between the design information created from the product CAD data and current parts management data, and technology in testing consistency between the pieces of design information created in each process is not disclosed.

With regard to a plurality of pieces of design information with different formats created in each process of an engineering chain, the present invention aims to provide a consistency test apparatus to test for consistency between one another.

Solution to Problem

A test apparatus of the present invention includes:
a conversion unit to convert formats of a plurality of pieces of design information, the plurality of pieces of design information being the design information created in each process of a plurality of processes in an engineering chain, to a format that can be compared between the pieces of design information, and to generate model information that indicates the design information, the format of which has been converted, for each piece of the design information; and
a test unit to associate a plurality of pieces of model information using entire reference information, the entire reference information being information that associates the plurality of pieces of design information, and to test for consistency between the pieces of model information associated.

Advantageous Effects of Invention

Since a consistency test apparatus of the present invention includes a conversion unit and a test unit, with regard to a plurality of pieces of design information with different formats created in each process of an engineering chain, consistency between one another can be tested.

DESCRIPTION OF EMBODIMENTS

The embodiment of the present invention will be described hereinafter using the drawings. Throughout the drawings, the same or corresponding portions are denoted by the same reference signs. In the description of the embodiment, a description of the same or corresponding portions will be suitably omitted or simplified.

Embodiment 1

A design management apparatus 100 of Embodiment 1 will be described by referring to FIG. 1 to FIG. 10. The design management apparatus 100 is a test apparatus.

Figure 1:
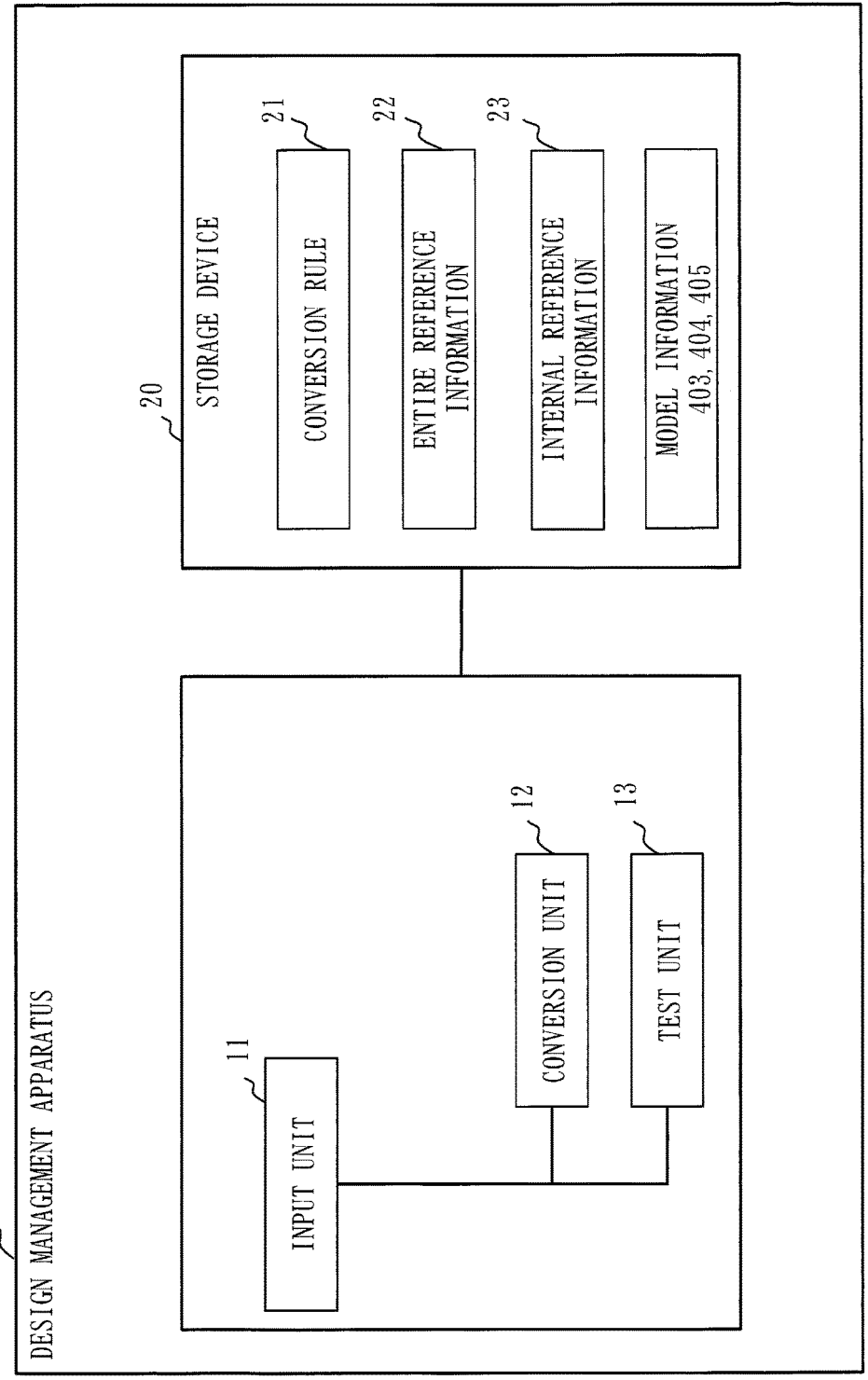
FIG. 1 is a diagram illustrating Embodiment 1, and a diagram illustrating a functional configuration of a design management apparatus 100.

FIG. 1 illustrates a functional configuration of the design management apparatus 100. The design management apparatus 100 is a test apparatus. The design management apparatus 100 includes an input unit 11, a conversion unit 12, and a test unit 13. The input unit 11 receives design information of each process of an engineering chain. The conversion unit 12 models the design information based on a conversion rule 21 and converts the design information to model information. The conversion rule 21, the design information, and the model information will be described later in the description of operation. The test unit 13 tests for consistency between the pieces of model information based on entire reference information 22 and internal reference information 23.

A storage device 20 stores the conversion rule 21, the entire reference information 22, the internal reference information 23, and the model information.

The design management apparatus 100 automatically tests for consistency between the design information and the design information by associating the pieces of design information created in each process of the engineering chain with one another by the entire reference information 22.

Figure 2:
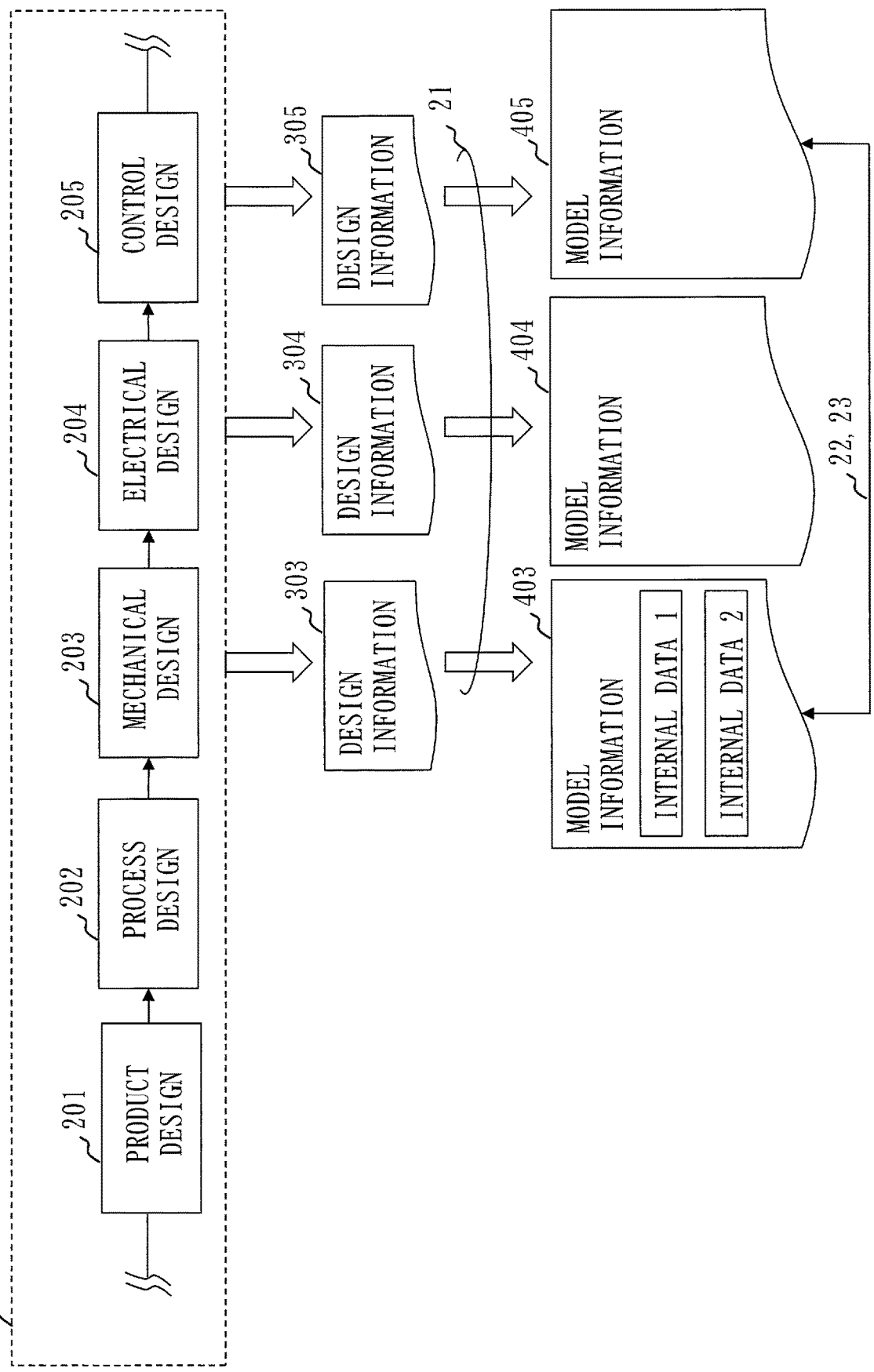
FIG. 2 is a diagram illustrating Embodiment 1, and a diagram illustrating a summary of an engineering chain 200.

FIG. 2 illustrates a summary of an engineering chain 200. The engineering chain 200 has a plurality of processes such as product design 201, process design 202, mechanical design 203, electrical design 204, control design 205, and the like. The design information is created in each process. Assume that the engineering chain 200 illustrated in FIG. 2 relates to a design of a production line in which bolts are produced.

Figure 3:
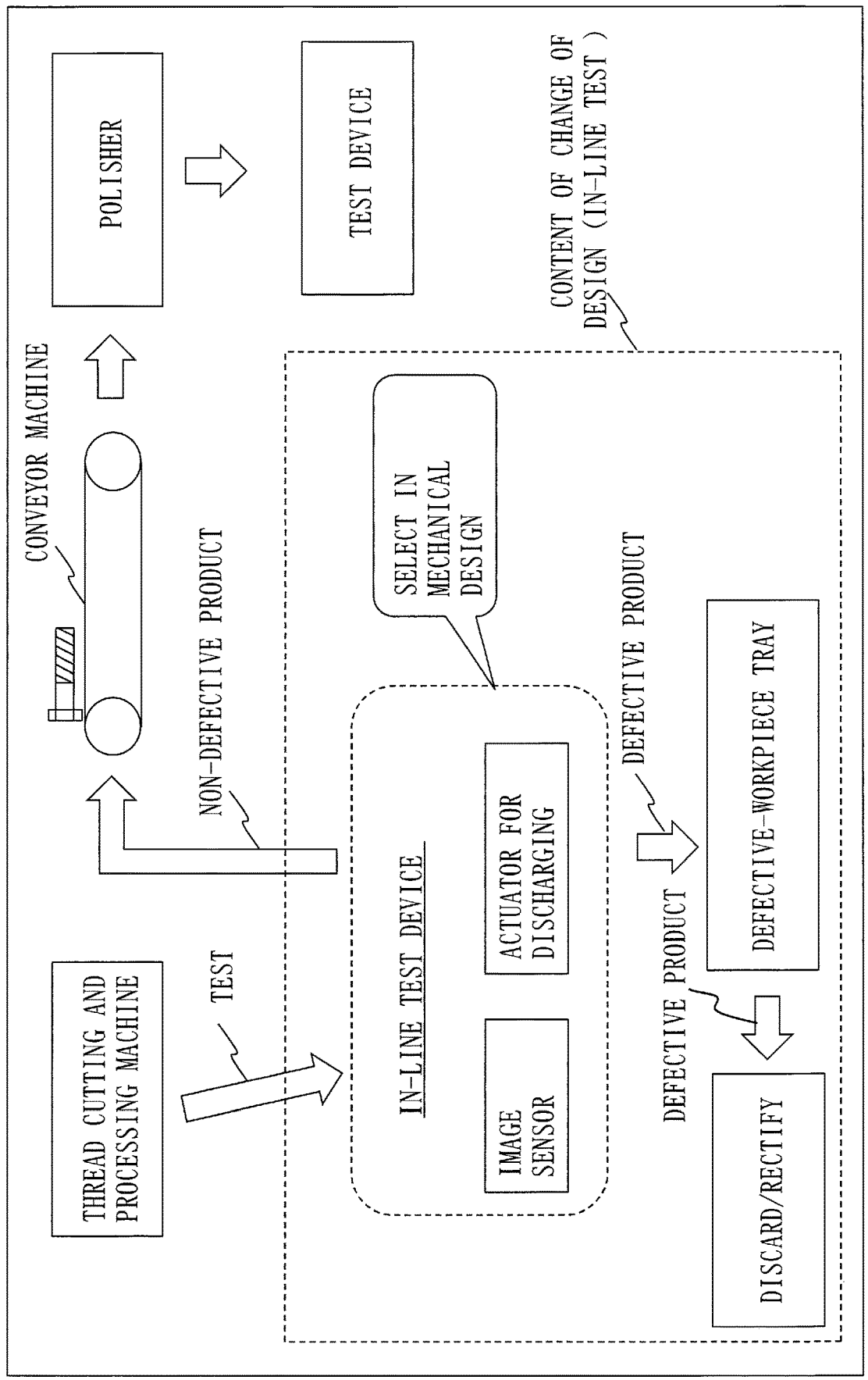
FIG. 3 is a diagram illustrating Embodiment 1, and a diagram illustrating a summary of a production line in which bolts are produced.

FIG. 3 illustrates a summary of a production line in which bolts are produced. The production line of bolts has a thread cutting and processing machine, an in-line test device, a conveyor machine, a polisher, and a test device. The in-line test device has a defective-workpiece discharge function. A production line such as the production line illustrated in FIG. 3 is designed by the engineering chain 200 of FIG. 2. In the engineering chain 200 of FIG. 2, a situation where design information 303 is created in the mechanical design 203, design information 304 is created in the electrical design 204, and design information 305 is created in the control design 205 is illustrated.

In the design management apparatus 100 of Embodiment 1, the conversion unit 12 converts formats of a plurality of pieces of design information, the plurality of pieces of design information being the design information created in each process of the plurality of processes in the engineering chain, to a format that can be compared between the design information, and generates model information that indicates the design information, the format of which has been converted, for each piece of the design information. The conversion unit 12 converts, using the conversion rule 21 in which a rule for format conversion is prescribed, the formats of the plurality of pieces of design information to a format that can be compared with one another. Information that is the design information with the format converted is the model information. To give a specific description by referring to FIG. 2, the conversion unit 12 generates model information 403 from the design information 303 by converting the format of the design information 303 according to the conversion rule 21, generates model information 404 from the design information 304 by converting the format of the design information 304 according to the conversion rule 21, and generates model information 405 from the design information 305 by converting the format of the design information 305 according to the conversion rule 21.

In FIG. 2, a situation where the test unit 13 tests for consistency between the model information 403 and the model information 405 is illustrated. Although internal data 1 and internal data 2 are illustrated in the model information 403, internal data will be described later.

* Description of Configuration *

Figure 4:
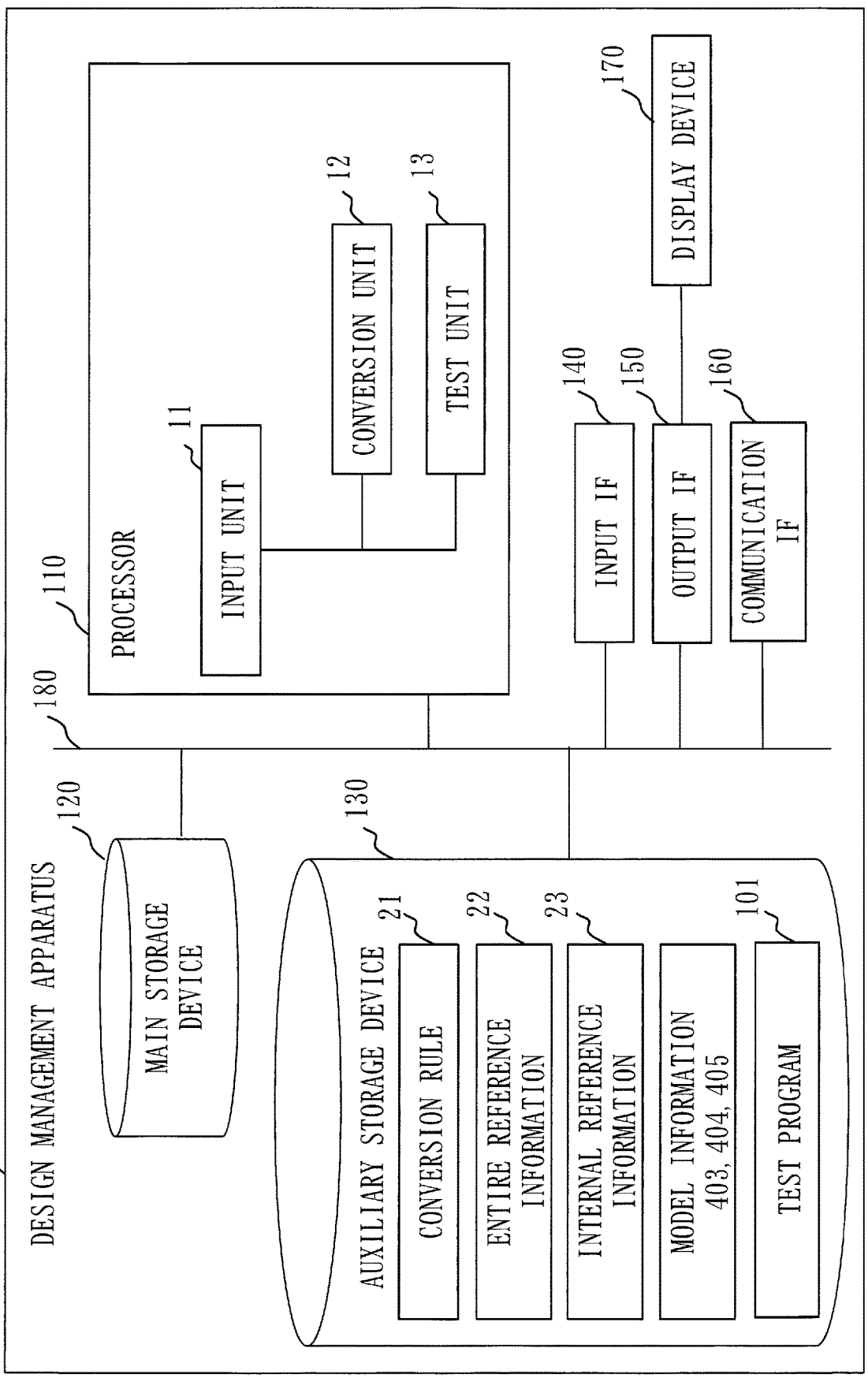
FIG. 4 is a diagram illustrating Embodiment 1, and a diagram illustrating a hardware configuration of the design management apparatus 100.

FIG. 4 illustrates a hardware configuration of the design management apparatus 100. The hardware configuration of the design management apparatus 100 will be described by referring to FIG. 4.

The design management apparatus 100 is a computer. Interface will be written as IF. The design management apparatus 100 includes a processor 110. Other than the processor 110, the design management apparatus 100 includes other hardware such as a main storage device 120, an auxiliary storage device 130, an input IF 140, an output IF 150, a communication IF 160, and a display device 170. The processor 110 is connected to other hardware via a signal line 180, and controls other hardware.

The design management apparatus 100 includes, as functional elements, the input unit 11, the conversion unit 12, and the test unit 13. Functions of the input unit 11, the conversion unit 12, and the test unit 13 are realized by a test program 101.

The processor 110 is a device that executes the test program 101. The test program 101 is stored in the auxiliary storage device 130. The test program 101 is a program that realizes the functions of the input unit 11, the conversion unit 12, and the test unit 13. The processor 110 is an IC (Integrated Circuit) that performs a calculation process. Specific examples of the processor 110 are a CPU (Central Processing Unit), a DSP (Digital Signal Processor), and a GPU (Graphics Processing Unit).

The main storage device 120 is a storage device. Specific examples of the main storage device 120 are an SRAM (Static Random Access Memory) and a DRAM (Dynamic Random Access Memory). The main storage device 120 retains a calculation result of the processor 110.

The auxiliary storage device 130 is a storage device that keeps data in a non-volatile manner. A specific example of the auxiliary storage device 130 is an HDD (Hard Disk Drive). The auxiliary storage device 130 may be a portable recording medium such as an SD (registered trademark) (Secure Digital) memory card, a NAND flash, a flexible disc, an optical disc, a compact disc, a Blu-ray (registered trademark) disc, or a DVD (Digital Versatile Disk).

The auxiliary storage device 130 realizes the storage device 20 of FIG. 1.

The input IF 140 is a port to which data from each device is inputted. The input unit 11 obtains the data via the input IF 140. The output IF 150 is a port to which various types of devices are connected, and from where data is outputted to the various types of devices by the processor 110. In FIG. 4, the display device 170 is connected to the output IF 150. The communication IF 160 is a communication port for the processor 110 to communicate with a different device.

The processor 110 loads the test program 101 from the auxiliary storage device 130 to the main storage device 120, reads the test program 101 from the main storage device 120, and executes the test program 101. Not only the test program 101 but also an OS (Operating System) is stored in the main storage device 120. The processor 110 executes the test program 101 while executing the OS. The design management apparatus 100 may include a plurality of processors that replace the processor 110. These plurality of processors share execution of the test program 101. Each processor, as with the processor 110, is a device that executes the test program 101. Data, information, signal values, and variable values used, processed, or outputted by the test program 101 are stored in the main storage device 120, the auxiliary storage device 130, or a register or a cache memory in the processor 110.

The test program 101 is a program that makes a computer execute each process, each procedure or each step being "process", "procedure", or "step" with which "unit" of the input unit 11, the conversion unit 12, and the test unit 13 are replaced.

A test method is a method that is performed by the design management apparatus 100, a computer, executing the test program 101. The test program 101 may be provided being stored in a computer-readable recording medium or may be provided as a program product.

* Description of Operation *

Figure 5:
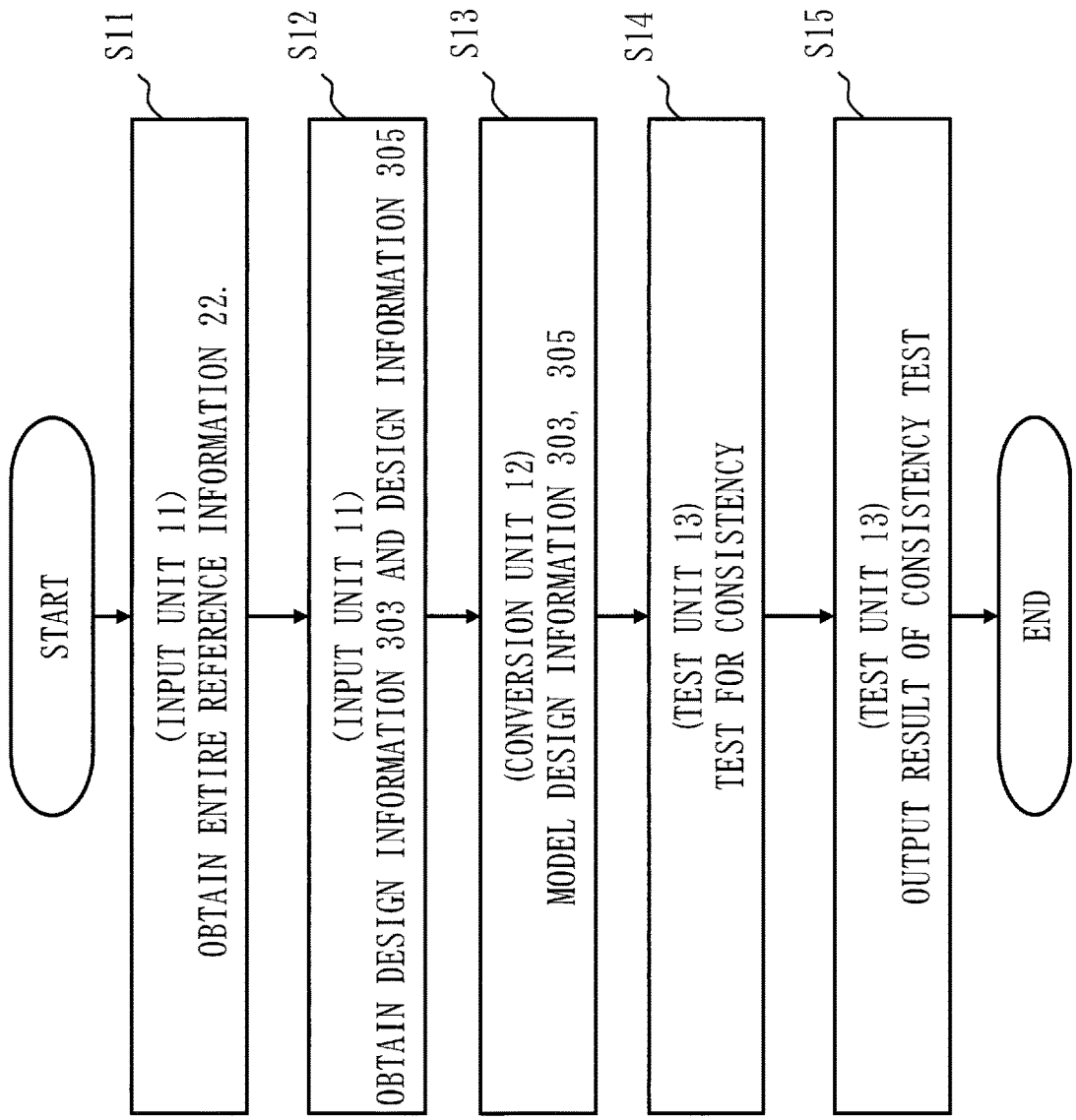
FIG. 5 is a diagram illustrating Embodiment 1, and a flowchart illustrating operation of the design management apparatus 100.

FIG. 5 is a flowchart illustrating operation of the design management apparatus 100. A functional element in parentheses indicated in each step of FIG. 5 indicates an agent.

Figure 6:
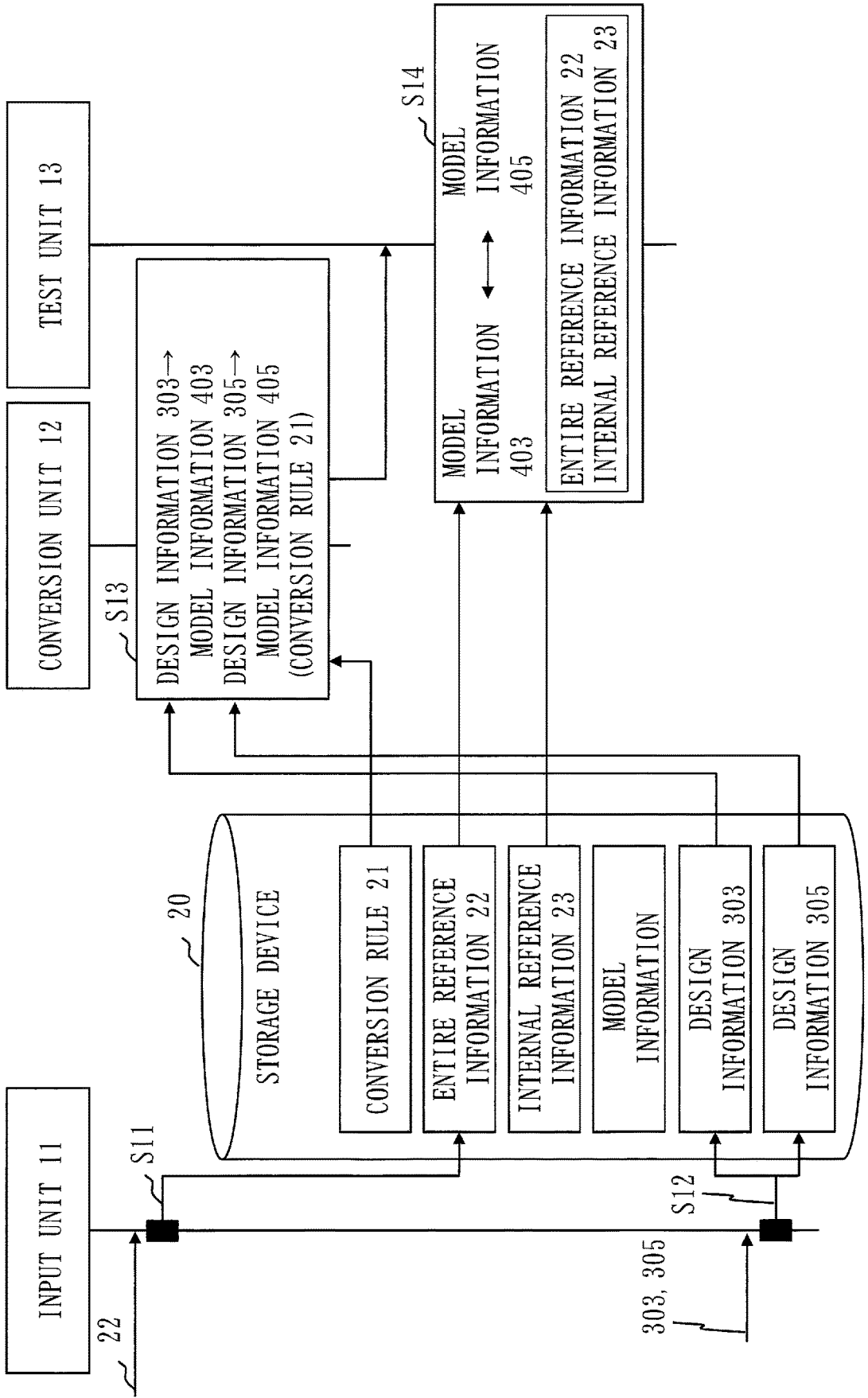
FIG. 6 is a diagram illustrating Embodiment 1, and a sequence of the operation of the design management apparatus 100.

FIG. 6 is a sequence of the operation of the design management apparatus 100. The operation of the design management apparatus 100 will be described by referring to FIG. 5 and FIG. 6. An operational procedure of the design management apparatus 100, the design management apparatus 100 being the test apparatus, is equivalent to the test method. A program that realizes the operation of the design management apparatus 100 is equivalent to the test program 101.

<Step S11>

In step S11 where the entire reference information 22 is obtained, the entire reference information 22 that is already created is inputted to the input unit 11. The input unit 11 obtains the entire reference information 22 and keeps the entire reference information 22 in the storage device 20.

<Entire Reference Information 22>

Figure 7:
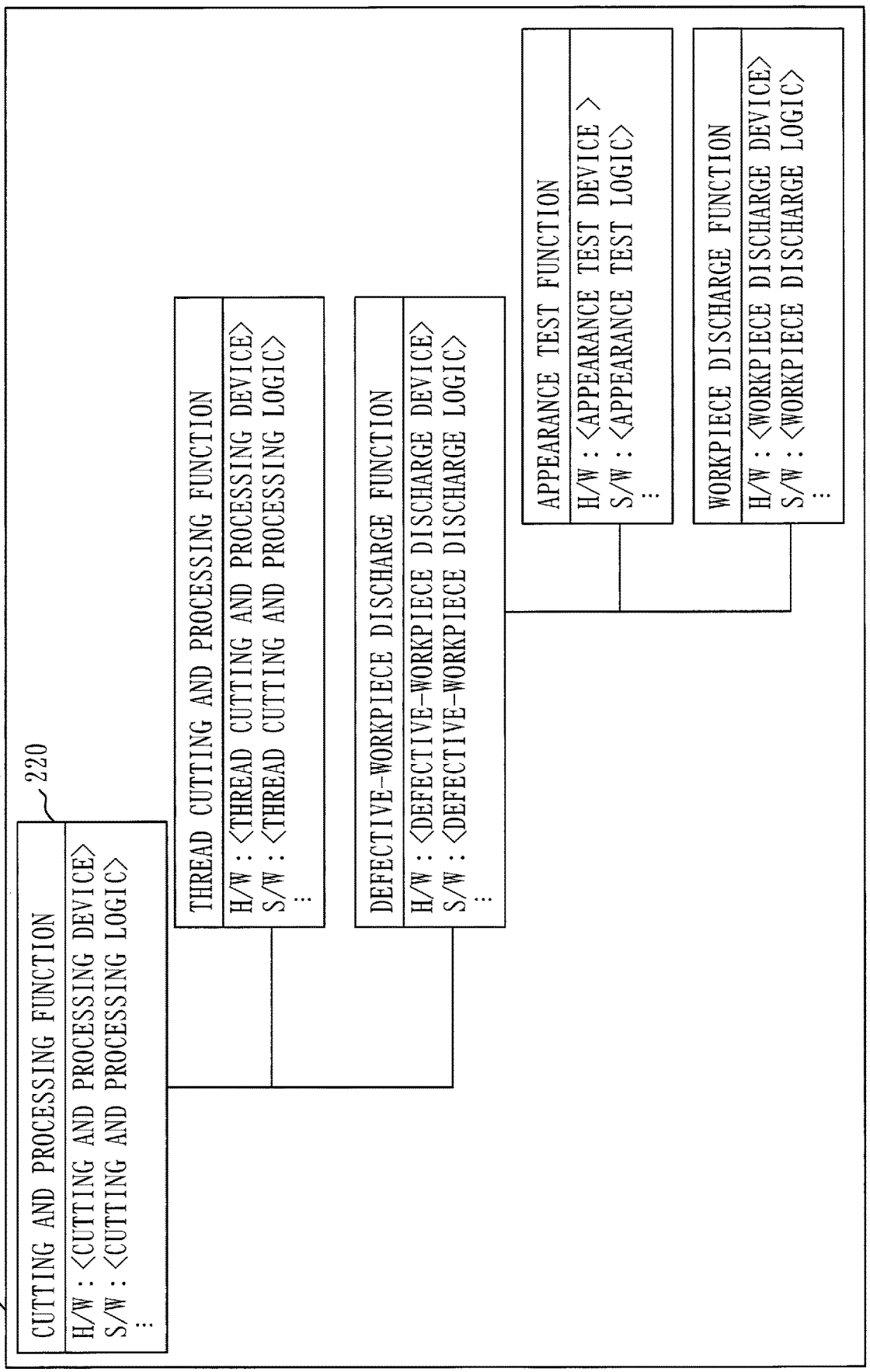
FIG. 7 is a diagram illustrating Embodiment 1, and a diagram illustrating entire reference information 22.

FIG. 7 illustrates the entire reference information 22. The entire reference information 22 is information for associating the plurality of pieces of design information created in each process of the engineering chain with one another. As long as the pieces of design information can be associated with one another, any information may be written in the entire reference information 22. It is a role of the entire reference information 22 to associate the pieces of design information with one another. Since the model information to be described later is created based on the design information, the pieces of model information can be associated with one another provided that the entire reference information 22 is used.

In the entire reference information 22, a line that is a design target is divided by function and is expressed hierarchically. Specifically, a cutting and processing function, a thread cutting and processing function, a defective-workpiece discharge function, an appearance test function, and a workpiece discharge function are written in the entire reference information 22. The entire reference information 22 corresponds to the production line of bolts of FIG. 3.

In the entire reference information 22, the design information is classified into two types: hardware and software. Hereinafter, hardware will be written as H/W and software will be written as S/W.

In the entire reference information 22 of FIG. 7, since it is assumed that each function is independent, a destination to which each of the H/W and the S/W refers to differs. In a case where there is, however, a connection between the functions, a same reference destination may be written across a plurality of functions or a plurality of reference destinations may be written for one function. Any classification other than the H/W and the S/W is possible to be added to the classification of the design information.

<Step S12>

In step S12 where the design information is obtained, each piece of design information created in each process of the engineering chain is inputted to the input unit 11. Assume that in step S12 of Embodiment 1, the design information 303 of the mechanical design 203 of FIG. 2 and the design information 305 of the control design 205 of FIG. 2 are inputted. A format of the design information, the design information being the design information to be inputted, may be a format specific to a tool that creates the design information. The format of the design information, the design information being the design information to be inputted, may be a format that is typically used such as xml (Extensible Markup Language). The format of the design information, the design information being the design information to be inputted, may be a format that is used commonly between similar tools, for example, in a case of CAD, a common format such as IGES (Initial Graphics Exchange Specification).

<Step S13>

In step S13 where the design information is modelled, the conversion unit 12 converts the design information to model information using the conversion rule 21. A rule for converting a format of the design information is written in the conversion rule 21. Hereinafter, a description will be given specifically. The conversion unit 12 performs format conversion of the design information 303 to the model information 403 using the conversion rule 21 and generates the model information 403 from the design information 303. Similarly, the conversion unit 12 performs format conversion of the design information 305 to the model information 405 using the conversion rule 21 and generates the model information 405 from the design information 305. The conversion unit 12 keeps the model information 403 and the model information 405 in the storage device 20.

<Step S14>

In step S14, the test unit 13 that tests for consistency between the pieces of model information associates a plurality of pieces of model information using the entire reference information 22, and tests for consistency between the pieces of model information associated. Specifically, the test unit 13 carries out a consistency test to test whether or not the model information 403 is consistent with the model information 405 using the entire reference information 22 and the internal reference information 23. The internal reference information 23 is information in which, with regard to the internal data that indicates data that has a possibility of being included internally in the model information, correspondence between the pieces of internal data is written. The model information 403, the model information 405, the entire reference information 22, and the internal reference information 23 are stored in the storage device 20. Although it is preferable to use the internal reference information 23, it is possible for the test unit 13 to test for consistency between the model information 403 and the model information 405 by not using the internal reference information 23 and using only the entire reference information 22.

Figure 8:
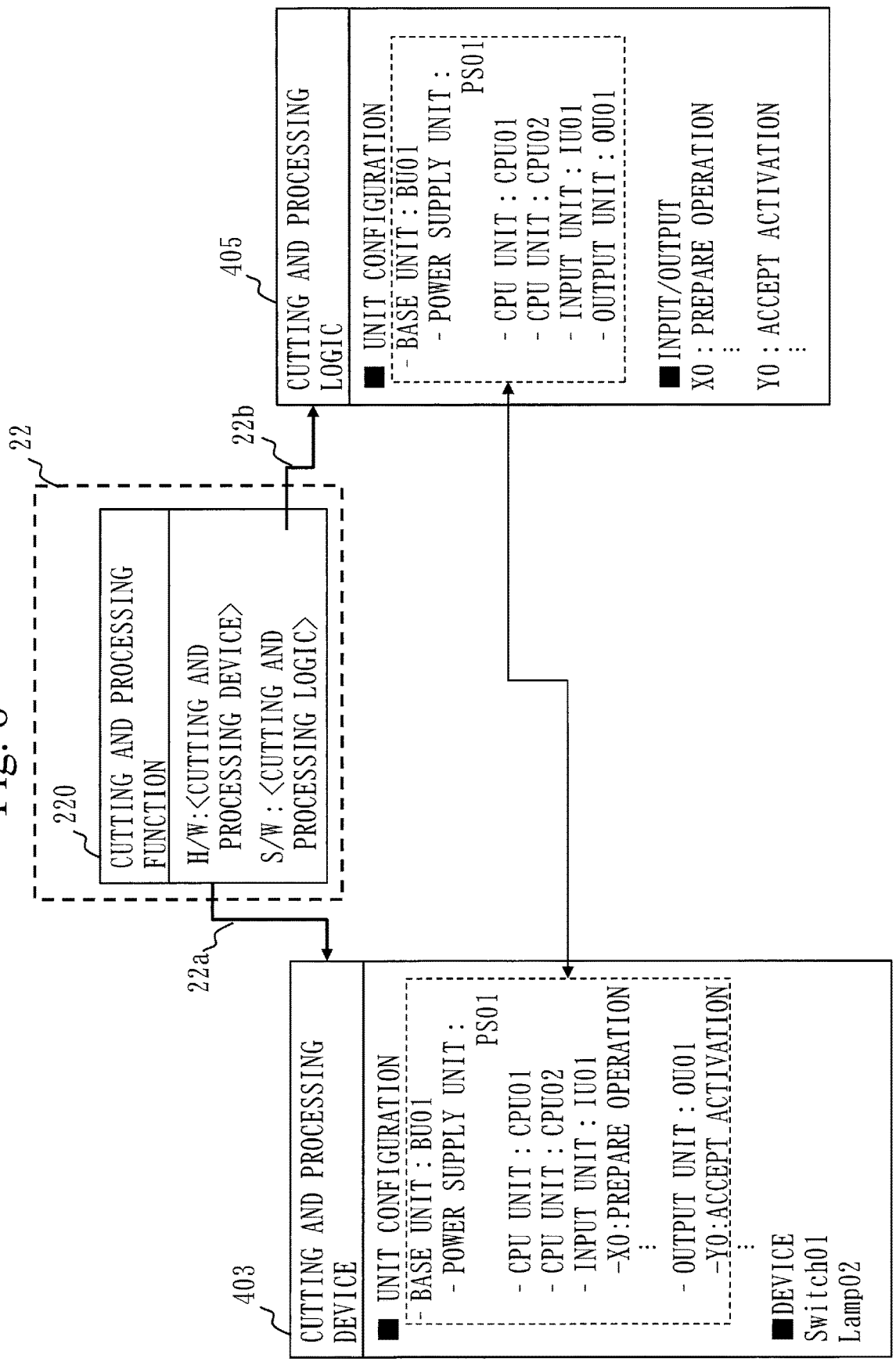
FIG. 8 is a diagram illustrating Embodiment 1, and a diagram illustrating a result of a consistency test by a test unit 13.

FIG. 8 illustrates a result of the consistency test between the model information 403 and the model information 405 by the test unit 13. FIG. 8 illustrates a case where the internal reference information 23 is not used. In FIG. 8, consistency between "unit configuration information and input/output information" included in the model information 403 and "unit configuration information and input/output information" included in the model information 405 are being tested by the test unit 13.

In FIG. 8, the model information 403 that is a cutting and processing device classified as H/W, and the model information 405 that is cutting and processing logic classified as S/W are being associated by a cutting and processing function 220 that is one of the functions indicated in the entire reference information 22. An arrow 22a and an arrow 22b indicate that the model information 403 and the model information 405 are being associated by the entire reference information 22.

In step S12, the design information 303 and 305 are inputted to the design management apparatus 100, and the model information 403 and 405 are generated from the design information 303 and 305. The test unit 13, however, does not know whether or not the model information 403 and the model information 405 can be associated at a point in time when the model information 403 and 405 are generated. By the test unit 13 collating the model information 403 with the model information 405 using the entire reference information 22 in step S14, the test unit 13 finds whether or not the model information 403 and the model information 405 can be associated.

The test unit 13 determines the model information 403 that is a cutting and processing device, and the model information 405 that is cutting and processing logic are both of a same configuration with regard to a base unit bordered by a dashed line. Therefore, the test unit 13 determines that the model information 403 and the model information 405 have consistency with regard to the base unit.

With regard to the internal data that indicates data included in the model information, the test unit 13 associates the pieces of internal data included in the model information with one another using the internal reference information 23 in which correspondence between the pieces of internal data is written. The test unit 13 tests whether or not first model information that indicates the model information in which the pieces of internal data are associated with one another and second model information that indicates model information associated with the first model information using the entire reference information 22 are consistent. Hereinafter, a description will be given specifically. Model information 403a below is the first model information in which the pieces of internal data are associated with one another, and model information 405a is the second model information.

Figure 9:
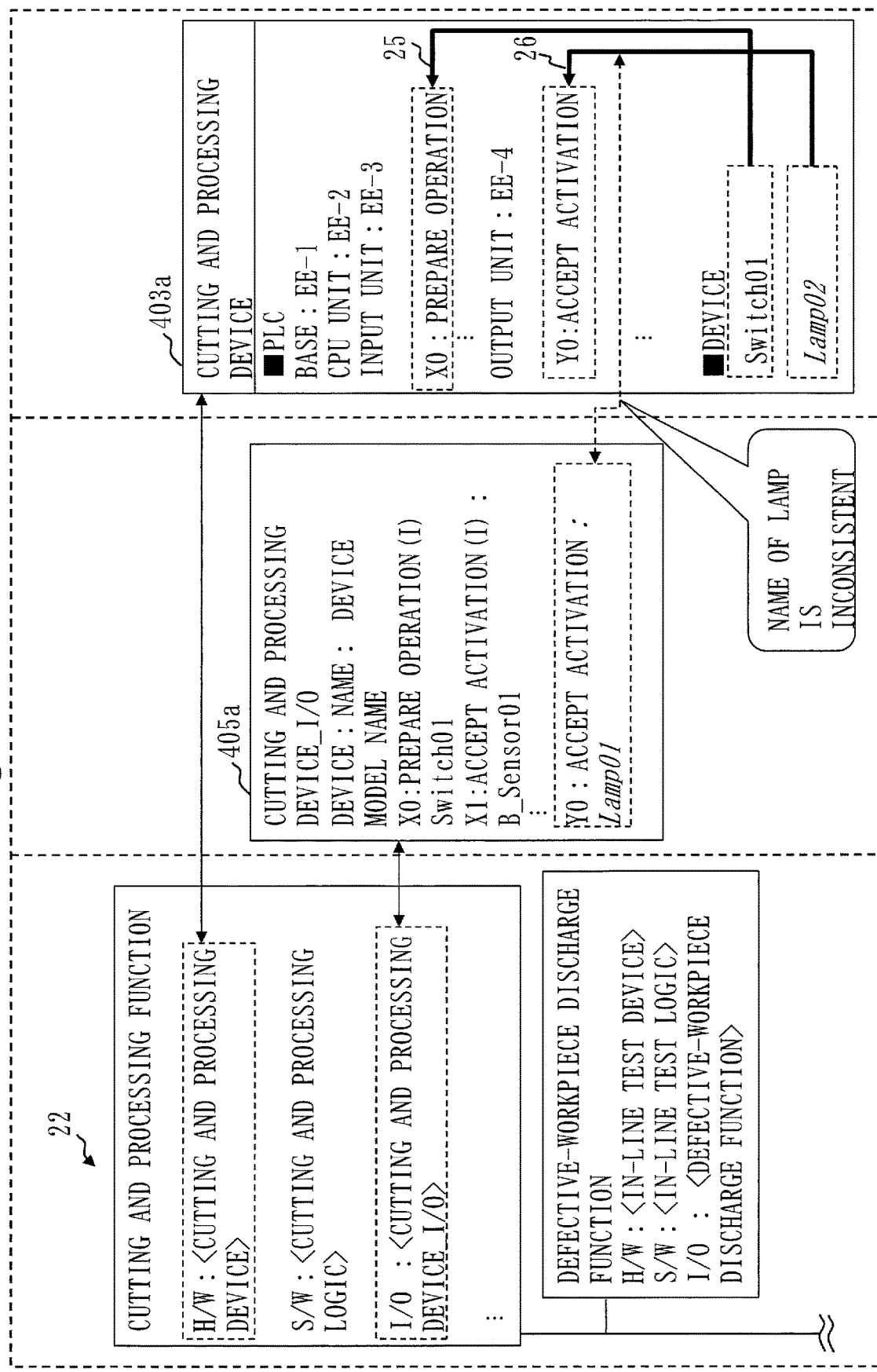
FIG. 9 is a diagram illustrating Embodiment 1, and a diagram illustrating a result of a consistency test in which internal reference information 23 is used.

FIG. 9 illustrates a result of a consistency test by the test unit 13 when using the internal reference information 23. In FIG. 9, a situation where the model information 403a and the model information 405a are being associated by the test unit 13 in the entire reference information 22 is illustrated. The model information 403a is information of the cutting and processing device, and the model information 405a is a cutting and processing device I/O (Input Output). The model information 403a is the model information the format of which has been converted from the design information of the mechanical design 203, and the model information 405a is the model information the format of which has been converted from the design information of the control design 205. The model information 403a and the model information 405a are associated by "H/W: <cutting and processing device>" and "I/O: <cutting and processing device I/O>" of the entire reference information 22. Furthermore, in the model information 403a, as an arrow 25 indicates, "Switch01", the internal data, is associated with "X0: Prepare Operation", the internal data, by the internal reference information 23.

As an arrow 26 indicates, "Lamp02", the internal data, is associated with "Y0: Accept Activation", the internal data. Relationship that the arrow 25 indicates exists as "X0: Prepare Operation (I) Switch01" in the model information 405a. On the other hand, relationship that the arrow 26 indicates in the model information 403a does not exist in the model information 405a. In the model information 405a, "Lamp01" is associated with "Y0: Accept Activation". That is, a name of a lamp differs in that, the name is "Lamp02" in the model information 403a, and the name is "Lamp01" in the model information 405a.

The test unit 13 finds the correspondence between the pieces of internal data that the arrow 26 in the model information 403a indicates by using the internal reference information 23. Therefore, since "Lamp02" corresponds to "Y0: Accept Activation" in the model information 403a, and "Lamp01" corresponds to "Y0: Accept Activation" in the model information 405a, the test unit 13 can determine that the name of the lamp that corresponds to "Y0: Accept Activation" is inconsistent. A more detailed verification of consistency is possible by using the internal reference information 23.

<Step S15>

Step S15 is a step to output a result of a consistency test. As described in step S14, the test unit 13 determines whether or not an element that the model information 403a has and an element that the model information 405a has are consistent when testing consistency between the model information 403a having the plurality of pieces of internal data as a plurality of elements and the model information 405a having the plurality of pieces of internal data as a plurality of elements. The model information 403a is one piece of model information and the model information 405a is another piece of model information. In a case where the test unit 13 determined that the element that the model information 403a has and the element that the model information 405a has are not consistent, the test unit 13 outputs the element that is determined as not consistent. Specifically, in a case of the example in FIG. 9, the test unit 13 displays, as the elements, "Y0: Accept Activation: Lamp02" of the model information 403a and "Y0: Accept Activation: Lamp01" of the model information 405a on the display device 170 via the output IF 150.

* Effect of Embodiment 1*

In the design management apparatus 100 of the present Embodiment 1, following effects can be obtained.

(1) With the design management apparatus 100, even in a case where tools that generate the design information differ or when the pieces of design information are of different processes, consistency between the pieces of design information can be confirmed.

(2) Since the test unit 13 outputs an inconsistent element, in a case where the test unit 13 detects a violation of consistency, an element that is violating consistency among the elements the design information has can be confirmed.

(3) Since consistency between a plurality of pieces of design information can be confirmed simultaneously, in a case where a change of design occurs in any of the steps in the engineering chain, design information that is affected can be confirmed by inputting design information after a change to the design management apparatus 100.

(4) Since work in which a designer creates the design information does not change before and after installing the design management apparatus 100, it is also possible to prevent an increase in person-hours of the designer.

<Supplement to Hardware Configuration>

In the design management apparatus 100 of FIG. 4, functions of the design management apparatus 100 are realized by software, but the functions of the design management apparatus 100 may be realized by hardware.

Figure 10:
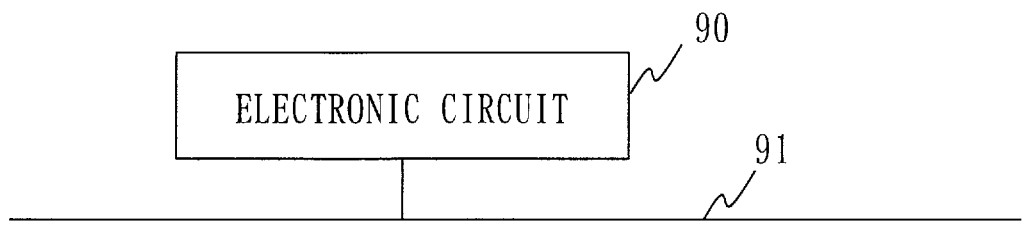
FIG. 10 is a diagram illustrating Embodiment 1, and a diagram illustrating a configuration in which functions of the design management apparatus 100 are realized by hardware.

FIG. 10 illustrates a configuration in which the functions of the design management apparatus 100 are realized by hardware. An electronic circuit 90 of FIG. 10 is a dedicated electronic circuit to realize the functions of the input unit 11, the conversion unit 12, and the test unit 13 of the design management apparatus 100. The electronic circuit 90 is connected to a signal line 91. The electronic circuit 90, specifically, is a single circuit, a composite circuit, a programmed processor, a parallel programmed processor, a logic IC, a GA, an ASIC, or an FPGA. GA is an abbreviation for Gate Array. ASIC is an abbreviation for Application Specific Integrated Circuit. FPGA is an abbreviation for Field-Programmable Gate Array. Functions of an element of the design management apparatus 100 may be realized by one electronic circuit or may be realized by being distributed to a plurality of electronic circuits. A part of the functions of an element of the design management apparatus 100 may be realized by the electronic circuit and the rest of the functions may be realized by software.

Each of the processor 110 and the electronic circuit 90 are also called processing circuitry. In the design management apparatus 100, the functions of the input unit 11, the conversion unit 12, and the test unit 13 may be realized by the processing circuitry.

Embodiment 1 has been described above, but the embodiment may be partially implemented. Or, of Embodiment 1, two or more may partially be combined and implemented. The present invention is not limited to Embodiment 1, and various modifications are possible as necessary.

REFERENCE SIGNS LIST

11: input unit; 12: conversion unit; 13: test unit; 20: storage device; 21: conversion rule; 22: entire reference information; 22a, 22b: arrow; 23: internal reference information; 25, 26: arrow; 100: design management apparatus; 101: test program; 110: processor; 120: main storage device; 130: auxiliary storage device; 140: input IF; 150: output IF; 160: communication IF; 200: engineering chain; 201: product design; 202: process design; 203: mechanical design; 204: electrical design; 205: control design; 220: cutting and processing function; 303, 304, 305: design information; 403, 404, 405: model information.

The invention claimed is:

1. A test apparatus comprising:
processing circuitry, wherein
the processing circuitry
converts formats of a plurality of pieces of design information, the plurality of pieces of design information being the design information created in each process of a plurality of processes in an engineering chain, to a format that can be compared between the pieces of design information, generates model information that indicates the design information, the format of which has been converted, for each piece of the design information,
associates a plurality of pieces of model information using entire reference information, the entire reference information being information that associates the plurality of pieces of design information, and tests for consistency between the pieces of model information associated, wherein
the processing circuitry further:
converts, using a conversion rule for format conversion, the formats of the plurality of pieces of design information to a format that can be compared with one another, and
generates each piece of model information in the plurality of pieces of model information from a corresponding one of the plurality of pieces of design information, by converting the format of the corresponding one of the plurality of pieces of design information according to the conversion rule.

2. The test apparatus according to claim 1, wherein
the processing circuitry
associates, with regard to the internal data that indicates data internally included in the model information, the pieces of internal data included internally in the model information with one another using internal reference information in which correspondence between the pieces of internal data is written, and
tests whether or not first model information that indicates the model information in which the pieces of internal data are associated with one another and second model information that indicates the model information associated with the first model information using the entire reference information are consistent.

3. The test apparatus according to claim 2, wherein the processing circuitry
determines, at a time of testing consistency between one piece of model information having a plurality of elements and another piece of model information having a plurality of elements, whether or not the element that the one piece of model information has and the element that the another piece of model information has are consistent, and in a case where the processing circuitry determines that the element that the one piece of model information has and the element that the another piece of model information has are not consistent, outputs the element determined as not consistent.

4. The test apparatus according to claim 1, wherein the processing circuitry
determines, at a time of testing consistency between one piece of model information having a plurality of elements and another piece of model information having a plurality of elements, whether or not the element that the one piece of model information has and the element that the another piece of model information has are consistent, and in a case where the processing circuitry determines that the element that the one piece of model information has and the element that the another piece of model information has are not consistent, outputs the element determined as not consistent.

5. A non-transitory computer readable medium storing a test program causing a computer to execute:
a conversion process to convert formats of a plurality of pieces of design information, the plurality of pieces of design information being the design information created in each process of a plurality of processes in an engineering chain, to a format that can be compared between the pieces of design information, and to generate model information that indicates the design information, the format of which has been converted, for each piece of the design information; and
a test process to associate a plurality of pieces of model information using entire reference information, the entire reference information being information that associates the plurality of pieces of design information, and to test for consistency between the pieces of model information associated, wherein
the conversion process further:
  converts, using a conversion rule for format conversion, the formats of the plurality of pieces of design information to a format that can be compared with one another, and
  generates each piece of model information in the plurality of pieces of model information from a corresponding one of the plurality of pieces of design information, by converting the format of the corresponding one of the plurality of pieces of design information according to the conversion rule.

6. A test method comprising:
converting formats of a plurality of pieces of design information, the plurality of pieces of design information being the design information created in each process of a plurality of processes in an engineering chain, to a format that can be compared between the pieces of design information,
generating model information that indicates the design information, the format of which has been converted, for each piece of the design information, and
by associating a plurality of pieces of model information using entire reference information, the entire reference information being information that associates the plurality of pieces of design information, testing for consistency between the pieces of model information associated, wherein
converting formats of the plurality of pieces of design information comprises using a conversion rule for format conversion to convert the formats of the plurality of pieces of design information to a format that can be compared with one another, and
generating the model information comprises generating each piece of model information in the plurality of pieces of model information from a corresponding one of the plurality of pieces of design information, by converting the format of the corresponding one of the plurality of pieces of design information according to the conversion rule.

* * * * *